US010992766B2

(12) United States Patent
Sharaby et al.

(10) Patent No.: US 10,992,766 B2
(45) Date of Patent: *Apr. 27, 2021

(54) ADAPTIVE COMPRESSION OF STORED DATA

(71) Applicant: Chicago Mercantile Exchange Inc., Chicago, IL (US)

(72) Inventors: Fateen Sharaby, Fort Lee, NJ (US); Sriram A. Raju Datla, Naperville, IL (US); Dhiraj Subhash Bawadhankar, Naperville, IL (US); John Charles Redfield, Brooklyn, NY (US); Justin Yeong-Juin Lee, Chicago, IL (US)

(73) Assignee: Chicago Mercantile Exchange Inc., Chicago, IL (US)

(*) Notice: Subject to any disclaimer, the term of this patent is extended or adjusted under 35 U.S.C. 154(b) by 0 days.

This patent is subject to a terminal disclaimer.

(21) Appl. No.: 16/792,973

(22) Filed: Feb. 18, 2020

(65) Prior Publication Data

US 2020/0186609 A1 Jun. 11, 2020

Related U.S. Application Data

(63) Continuation of application No. 15/832,244, filed on Dec. 5, 2017, now Pat. No. 10,609,172.

(Continued)

(51) Int. Cl.
*G06F 15/16* (2006.01)
*H04L 29/08* (2006.01)
(Continued)

(52) U.S. Cl.
CPC .......... *H04L 67/2828* (2013.01); *G06F 3/061* (2013.01); *G06F 3/0608* (2013.01);
(Continued)

(58) Field of Classification Search
USPC ....... 709/203, 206, 217, 219, 223, 224, 226, 709/228, 230, 231, 232, 238, 247
See application file for complete search history.

(56) References Cited

U.S. PATENT DOCUMENTS 5,068,816 A 11/1991 Noetzel
5,274,813 A 12/1993 Itoh
(Continued)

FOREIGN PATENT DOCUMENTS

WO WO0150076 A1 7/2001

OTHER PUBLICATIONS

"TriOptima and LCH.Clearnet Compression of Cleared Interest Rate Swaps Exceeds $100 Trillion in Notational; $20.4 Trillion Compressed in 2012 Alone", ICAP, Feb. 23, 2012, http://www.icap.com/news/2012/trioptima-swap-clear-usd100-trillion.aspx, 2 pages.

(Continued)

*Primary Examiner* — Quang N Nguyen
(74) *Attorney, Agent, or Firm* — Lempia Summerfield Katz LLC

(57) ABSTRACT

Systems, devices and methods for adaptive compression of stored information includes a memory management computing device programmed to monitor a size of a plurality of data structures stored in a data repository. The computing device compares the size of each of a plurality of data structures to a predetermined threshold. When a size of an uncompressed data structure meets the threshold, the memory management computing device calculates a value of a first compression parameter based on a value of a first parameter and a value of a second parameter of each data element of the uncompressed data structure, calculates a value of a second compression parameter based the value of the first parameter of each data element of the uncompressed data structure, generates a compressed data structure based (Continued)

on the value of the first compression parameter and the second compression parameter; and replaces, in the data repository, the uncompressed data structure with the compressed data structure.

20 Claims, 5 Drawing Sheets

Related U.S. Application Data

(60) Provisional application No. 62/491,040, filed on Apr. 27, 2017.

(51) Int. Cl.
    *H04L 29/06*     (2006.01)
    *H03M 7/30*     (2006.01)
    *G06F 3/06*     (2006.01)
    *H04L 12/26*     (2006.01)
    *G06F 16/22*     (2019.01)

(52) U.S. Cl.
    CPC ............. *G06F 16/22* (2019.01); *H03M 7/30* (2013.01); *H04L 43/16* (2013.01); *H04L 69/04* (2013.01)

(56) References Cited

U.S. PATENT DOCUMENTS

| | | |
|---|---|---|
| 5,978,511 A | 11/1999 | Horiuchi |
| 6,064,985 A | 5/2000 | Anderson |
| 6,278,981 B1 | 8/2001 | Dembo et al. |
| 6,282,520 B1 | 8/2001 | Schirripa |
| 6,304,858 B1 | 10/2001 | Mosler |
| 6,317,727 B1 | 11/2001 | May |
| 6,333,788 B1 | 12/2001 | Yamada |
| 6,385,249 B1 | 5/2002 | Kondo |
| 6,424,972 B1 | 7/2002 | Berger |
| 7,181,422 B1 | 2/2007 | Philip |
| 7,222,317 B1 | 5/2007 | Mathur |
| 7,236,952 B1 | 6/2007 | D Zmura |
| 7,349,878 B1 | 3/2008 | Makivic |
| 7,430,539 B2 | 9/2008 | Glinberg |
| 7,451,237 B2 * | 11/2008 | Takekawa ............... H04L 69/04 |
| | | 709/247 |
| 7,509,275 B2 | 3/2009 | Glinberg |
| 7,580,876 B1 | 8/2009 | Phillips |
| 7,587,641 B1 | 9/2009 | Sloane |
| 7,702,563 B2 | 4/2010 | Balson |
| 7,734,538 B2 | 6/2010 | Bauerschmidt |
| 7,809,631 B2 | 10/2010 | Bauerschmidt et al. |
| 7,822,668 B1 | 10/2010 | Benda |
| 7,870,052 B1 | 1/2011 | Goldberg |
| 8,108,281 B2 | 1/2012 | Koblas |
| 8,165,942 B1 | 4/2012 | Rordorf |
| 8,301,537 B1 | 10/2012 | Rachev |
| 8,515,058 B1 | 8/2013 | Gentry |
| 8,725,621 B2 | 5/2014 | Marynowski |
| 8,805,735 B1 | 8/2014 | Goldberg |
| 8,862,560 B1 | 10/2014 | Wu |
| 9,106,936 B2 * | 8/2015 | Wegener ............ H04N 21/2381 |
| 9,396,131 B1 | 7/2016 | Hendry |
| 9,800,885 B2 * | 10/2017 | Newman .......... G11B 20/00007 |
| 10,194,097 B2 * | 1/2019 | Abbas .................... H04N 5/265 |
| 10,203,879 B2 | 2/2019 | Yamato |
| 10,203,897 B1 * | 2/2019 | Cheah .................... G06F 13/20 |
| 10,326,862 B2 | 6/2019 | Bonig et al. |
| 2002/0002528 A1 | 1/2002 | Terada |
| 2002/0038272 A1 | 3/2002 | Menchero |
| 2002/0138386 A1 | 9/2002 | Maggioncalda |
| 2003/0028466 A1 | 2/2003 | Jenson |
| 2003/0036918 A1 | 2/2003 | Pintsov |
| 2003/0055777 A1 | 3/2003 | Ginsberg |
| 2003/0061577 A1 | 3/2003 | Saluja |
| 2003/0101026 A1 | 5/2003 | Rabinowitz |
| 2003/0236738 A1 | 12/2003 | Lange |
| 2004/0177023 A1 | 9/2004 | Krowas |
| 2004/0186804 A1 | 9/2004 | Chakraborty |
| 2004/0199448 A1 | 10/2004 | Chalermkraivuth |
| 2004/0205457 A1 | 10/2004 | Bent |
| 2004/0220870 A1 | 11/2004 | Lundberg |
| 2005/0050372 A1 | 3/2005 | Hagiwara |
| 2005/0055301 A1 | 3/2005 | Cohen |
| 2005/0096950 A1 | 5/2005 | Caplan |
| 2006/0059067 A1 | 3/2006 | Glinberg |
| 2006/0112049 A1 | 5/2006 | Mehrotra |
| 2006/0224494 A1 | 10/2006 | Pinkava |
| 2006/0259378 A1 | 11/2006 | Fornasari |
| 2007/0033123 A1 | 2/2007 | Navin |
| 2007/0083586 A1 | 4/2007 | Luo |
| 2007/0156555 A1 | 7/2007 | Orr |
| 2007/0186206 A1 | 8/2007 | Abrams |
| 2007/0198387 A1 | 8/2007 | Uenohara |
| 2007/0244785 A1 | 10/2007 | Williams |
| 2007/0271204 A1 | 11/2007 | Jiang |
| 2007/0288351 A1 | 12/2007 | Huntley |
| 2008/0120251 A1 | 5/2008 | Tyagi |
| 2008/0183615 A1 | 7/2008 | Rio |
| 2008/0196076 A1 | 8/2008 | Shatz |
| 2008/0235172 A1 | 9/2008 | Rosenstein |
| 2008/0249956 A1 | 10/2008 | Connors |
| 2008/0249958 A1 | 10/2008 | Anguish |
| 2008/0294571 A1 | 11/2008 | Maloney |
| 2008/0319920 A1 | 12/2008 | Levin |
| 2009/0138536 A1 | 5/2009 | Chao |
| 2009/0171826 A1 | 7/2009 | Hadi |
| 2009/0216824 A1 | 8/2009 | Weinberg |
| 2009/0248564 A1 | 10/2009 | Fallon |
| 2009/0265284 A1 | 10/2009 | Rowell |
| 2009/0281956 A1 | 11/2009 | An |
| 2009/0299910 A1 | 12/2009 | Khuong-huu |
| 2009/0307124 A1 | 12/2009 | Meyerhoff |
| 2010/0106633 A1 | 4/2010 | Iyer |
| 2010/0138362 A1 | 6/2010 | Whitehurst |
| 2010/0145875 A1 | 6/2010 | Schmid |
| 2010/0191628 A1 | 7/2010 | Arnott |
| 2010/0259204 A1 | 10/2010 | Imura |
| 2010/0280970 A1 | 11/2010 | Lai |
| 2010/0281086 A1 | 11/2010 | Ganai |
| 2010/0323350 A1 | 12/2010 | Gordon |
| 2010/0328530 A1 | 12/2010 | Hashimoto |
| 2011/0004568 A1 | 1/2011 | Phillips |
| 2011/0035342 A1 | 2/2011 | Koblas |
| 2011/0060603 A1 | 3/2011 | Capelli |
| 2011/0153521 A1 | 6/2011 | Green |
| 2011/0161244 A1 | 6/2011 | Iyer |
| 2011/0179112 A1 | 7/2011 | Ravichandran |
| 2011/0221489 A1 | 9/2011 | Tarng |
| 2011/0270670 A1 * | 11/2011 | Leathern ............... G06Q 30/02 |
| | | 705/14.41 |
| 2012/0296793 A1 | 11/2012 | Wilson, Jr. |
| 2012/0317011 A1 | 12/2012 | Duquette |
| 2013/0018769 A1 | 1/2013 | Boudreault |
| 2013/0018818 A1 | 1/2013 | Yadav |
| 2013/0036074 A1 | 2/2013 | Kaestel |
| 2013/0041799 A1 | 2/2013 | Nyhoff |
| 2013/0041843 A1 | 2/2013 | Nyhoff |
| 2013/0117197 A1 | 5/2013 | Shah |
| 2013/0241933 A1 | 9/2013 | Thatcher |
| 2013/0282554 A1 | 10/2013 | Boberski |
| 2013/0339272 A1 | 12/2013 | Willism, III |
| 2014/0023167 A1 | 1/2014 | Meyer |
| 2014/0258072 A1 | 9/2014 | Mayor |
| 2015/0039530 A1 | 2/2015 | Jha et al. |
| 2015/0063374 A1 | 3/2015 | Venkatachalam Jayaraman |
| 2015/0324914 A1 | 11/2015 | Zhan et al. |
| 2015/0365619 A1 | 12/2015 | Mayer |
| 2016/0077973 A1 * | 3/2016 | Patsilaras ............ G06F 12/0851 |
| | | 711/3 |
| 2016/0246266 A1 | 8/2016 | Kniazev |
| 2016/0285571 A1 | 9/2016 | Badiu |
| 2017/0061329 A1 | 3/2017 | Kobayashi |
| 2018/0247191 A1 | 8/2018 | Katz |

(56) References Cited

U.S. PATENT DOCUMENTS

2020/0117649 A1* 4/2020 Arnold .............. H04L 67/1097
2020/0210411 A1* 7/2020 Yang ..................... G06F 16/245
2020/0249869 A1* 8/2020 Glimcher ............... H03M 7/30
2020/0301904 A1* 9/2020 Hirata .................... H03M 7/30

OTHER PUBLICATIONS

Extended European Search Report in EP Application No. 15174114. 7, dated Nov. 4, 2015, 6 pages.
Extended European Search Report in EP Application No. 15191983. 4, dated Dec. 17, 2015, 6 pages.
International Search Report in International Patent Application No. PCT/US2015/029941, dated Aug. 10, 2015, 2 pages.
Isda, Interest Rate Swaps Compression: A Progress Report, ISDA Study, 9 pages, Feb. 2012.
Labuszewski et al., "Speculative Strategies with Treasure Options", CME Group, Nov. 11, 2013, 36 pages.
Office Action in European Patent Application No. 15174114.7, dated Jun. 13, 2018, 7 pages.
Orcun Kaya, "Reforming OTC Derivatives Markets, Observable Changes and Open Issues", Deutsche Bank, Current Issues, Global Financial Markets, Aug. 7, 2013, 24 pages.
Risk Management—Portfolio Compression for Outstanding Interest Rate Swap Trades, https://www.ccilindia.com/riskmanagement/pages/portfoliocompression.aspx, developed by NSE-IT and maintained by CCIL-IT, 1 page, May 6, 2014.

* cited by examiner

FIG. 3

FIG. 4

ADAPTIVE COMPRESSION OF STORED DATA

REFERENCE TO RELATED APPLICATIONS

This application is a continuation under 37 C.F.R. § 1.53(b) of U.S. patent application Ser. No. 15/832,244 filed Dec. 5, 2017 now U.S. Pat. No. 10,609,172, which claims the benefit of the filing date under 35 U.S.C. § 119(e) U.S. Provisional Patent Application Ser. No. 62/491,040, filed Apr. 27, 2017, the entire disclosures of each of which are hereby incorporated by reference.

BACKGROUND

While costs associated with computers and memory storage products have been falling, with technological improvements, available computing resources of organizations remain at a premium. For example, as businesses increasingly move toward electronic communications, electronic processing of business processes, and electronically monitoring these communications and business processes, memory usage and computing processing power needs increase accordingly. In many cases, computing centers tasked with implementing and maintaining the discussed electronic communications and business processes are constrained by existing or aging hardware and software resources, budgetary concerns regarding the purchase, upgrade, or repair of the hardware and software infrastructure components. This may be true for large or small business organizations. In an illustrative example, a large organization may have many clients engaging in large numbers of electronic transactions, the details of which may be stored in memory. In many cases, these electronic transactions may occur continually and/or concurrently with electronic transactions with multiple other clients. As such, memory storage requirements may increase to a predefined limit, such that computing resources may be depleted, before additional resources may be added to the system. Additionally, the data stored may be communicated between computing systems for processing. These communication requirements may result in slowed communications capability, as communication bandwidth on an organizations network may be finite, regardless of how much data must be communicated. As such, a need has been recognized for improved data management capabilities, in storage capacity and transmission bandwidth management, while maintaining desired parameters of the underlying data.

SUMMARY OF THE INVENTION

Systems and methods are described for reducing memory storage and communication bandwidth requirements by compressing data based on the underlying stored information. A memory management computing device may be programmed to monitor a size of a plurality of data structures stored in a data repository. The computing device may compare the size of each of a plurality of data structures to a predetermined threshold. When a size of an uncompressed data structure meets the threshold, the memory management computing device may calculate a value of a first compression parameter based on a value of a first parameter and a value of a second parameter of each data element of the uncompressed data structure, calculate a value of a second compression parameter based on the value of the first parameter of each data element of the uncompressed data structure, and generate a compressed data structure based on the value of the first compression parameter and the second compression parameter. The memory management computing device may replace, in the data repository, the uncompressed data structure with the compressed data structure.

In an illustrative example, a data repository associated with a financial institution may store thousands of data structures, each having up to ten thousand data elements, where each data structure stores electronic information associated with a different portfolio and each line item of a particular data structure may correspond to an electronic transaction associated with the portfolio. In some cases, the financial institution may be required to store a record of each electronic transaction to meet one or more regulatory requirements. As such, as the number of electronic transactions increases, particularly for institutional trading firms, the number of records to be stored may exceed an allowable memory allocation size in a relatively short time. In some cases, the electronic data structures corresponding to electronic portfolios may be synchronized over a network between two or more computing systems one or more times a day. In some cases, synchronization may be performed on a real-time (or near real-time) basis. In such cases, synchronizing thousands of portfolios, each including thousands of transactions, may cause communication traffic to slow, particularly during periods of high communication traffic. By actively monitoring a size of each portfolio data structure, memory usage may be proactively managed to minimize memory usage requirements and limit manpower and equipment costs in installing, testing, and activating additional storage devices. Similarly, communications delays may be minimized through actively managing the size of the data structures communicated and/or synchronized between different computing systems. Through active management of data structure size, communication times and/or delays may be minimized proportionally.

The details of these and other embodiments of the present disclosure are set forth in the accompanying drawings and the description below. Other features and advantages of the invention will be apparent from the description and drawings.

BRIEF DESCRIPTION OF THE DRAWINGS

The present invention may take physical form in certain parts and steps, embodiments of which will be described in detail in the following description and illustrated in the accompanying drawings that form a part hereof, wherein:

FIGS. 3 and 4 show illustrative data tables corresponding to a method for adaptive compression of stored data according to aspects of the disclosure.

DETAILED DESCRIPTION

Illustrative Operating Environment

Figure 1:
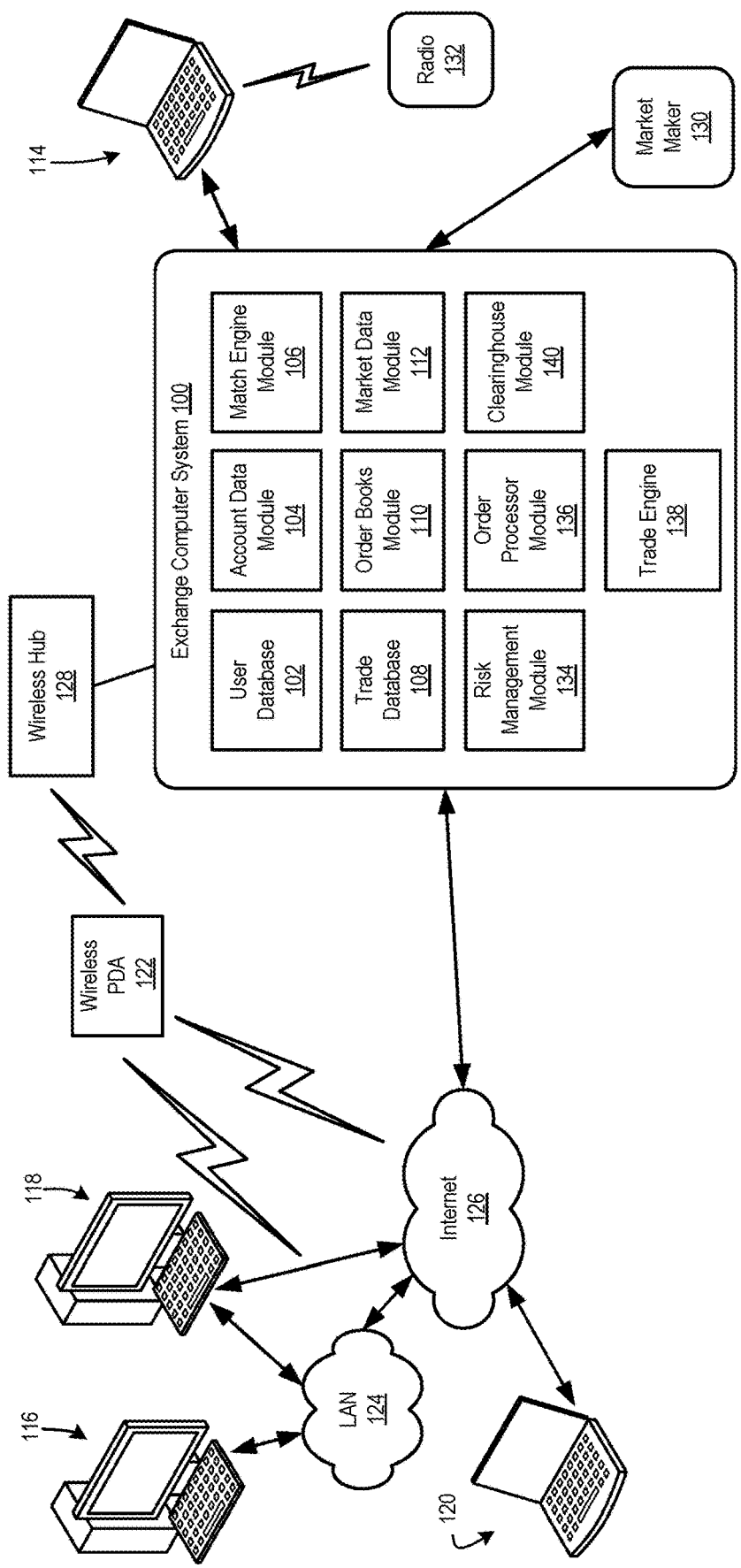
FIG. 1 shows an illustrative trading network environment for implementing trading systems and methods according to aspects of the disclosure.

Aspects of at least some embodiments can be implemented with computer systems and computer networks that allow users to communicate trading information. An exemplary trading network environment for implementing trading systems and methods according to at least some embodiments is shown in FIG. 1. The implemented trading systems and methods can include systems and methods, such as are described herein, that facilitate trading and other activities associated with financial products based on currency pairs.

Computer system 100 can be operated by a financial product exchange and configured to perform operations of the exchange for, e.g., trading and otherwise processing various financial products. Financial products of the exchange may include, without limitation, futures contracts, options on futures contracts ("futures contract options"), and other types of derivative contracts. Financial products traded or otherwise processed by the exchange may also include over-the-counter (OTC) products such as OTC forwards, OTC options, etc.

Computer system 100 receives orders for financial products, matches orders to execute trades, transmits market data related to orders and trades to users, and performs other operations associated with a financial product exchange. Exchange computer system 100 may be implemented with one or more mainframe, desktop or other computers. In one embodiment, a computer device uses one or more 64-bit processors. A user database 102 includes information identifying traders and other users of exchange computer system 100. Data may include user names and passwords. An account data module 104 may process account information that may be used during trades. A match engine module 106 is included to match prices and other parameters of bid and offer orders. Match engine module 106 may be implemented with software that executes one or more algorithms for matching bids and offers.

A trade database 108 may be included to store information identifying trades and descriptions of trades. In particular, a trade database may store information identifying the time that a trade took place and the contract price. An order book module 110 may be included to store prices and other data for bid and offer orders, and/or to compute (or otherwise determine) current bid and offer prices. A market data module 112 may be included to collect market data, e.g., data regarding current bids and offers for futures contracts, futures contract options and other derivative products. Module 112 may also prepare the collected market data for transmission to users. A risk management module 134 may be included to compute and determine a user's risk utilization in relation to the user's defined risk thresholds. An order processor module 136 may be included to decompose delta based and bulk order types for further processing by order book module 110 and match engine module 106.

A clearinghouse module 140 may be included as part of exchange computer system 100 and configured to carry out clearinghouse operations. Module 140 may receive data from and/or transmit data to trade database 108 and/or other modules of computer system 100 regarding trades of futures contracts, futures contracts options, OTC options and contracts, and other financial products. Clearinghouse module 140 may facilitate the financial product exchange acting as one of the parties to every traded contract or other product. For example, computer system 100 may match an offer by party A to sell a financial product with a bid by party B to purchase a like financial product. Module 140 may then create a financial product between party A and the exchange and an offsetting second financial product between the exchange and party B. As another example, module 140 may maintain margin data with regard to clearing members and/or trading customers. As part of such margin-related operations, module 140 may store and maintain data regarding the values of various contracts and other instruments, determine mark-to-market and final settlement amounts, confirm receipt and/or payment of amounts due from margin accounts, confirm satisfaction of final settlement obligations (physical or cash), etc. As discussed in further detail below, module 140 may determine values for performance bonds associated with trading in products based on various types of currency pairs.

Each of modules 102 through 140 could be separate software components executing within a single computer, separate hardware components (e.g., dedicated hardware devices) in a single computer, separate computers in a networked computer system, or any combination thereof (e.g., different computers in a networked system may execute software modules corresponding more than one of modules 102-140).

Computer device 114 is shown directly connected to exchange computer system 100. Exchange computer system 100 and computer device 114 may be connected via a T1 line, a common local area network (LAN) or other mechanism for connecting computer devices. Computer device 114 is shown connected to a radio 132. The user of radio 132 may be a trader or exchange employee. The radio user may transmit orders or other information to a user of computer device 114. The user of computer device 114 may then transmit the trade or other information to exchange computer system 100.

Computer devices 116 and 118 are coupled to a LAN 124. LAN 124 may implement one or more of the well-known LAN topologies and may use a variety of different protocols, such as Ethernet. Computers 116 and 118 may communicate with each other and other computers and devices connected to LAN 124. Computers and other devices may be connected to LAN 124 via twisted pair wires, coaxial cable, fiber optics, radio links or other media.

A wireless personal digital assistant device (PDA) 122 may communicate with LAN 124 or the Internet 126 via radio waves. PDA 122 may also communicate with exchange computer system 100 via a conventional wireless hub 128. As used herein, a PDA includes mobile telephones and other wireless devices that communicate with a network via radio waves.

FIG. 1 also shows LAN 124 connected to the Internet 126. LAN 124 may include a router to connect LAN 124 to the Internet 126. Computer device 120 is shown connected directly to the Internet 126. The connection may be via a modem, DSL line, satellite dish or any other device for connecting a computer device to the Internet. Computers 116, 118 and 120 may communicate with each other via the Internet 126 and/or LAN 124.

One or more market makers 130 may maintain a market by providing constant bid and offer prices for a derivative or security to exchange computer system 100. Exchange computer system 100 may also include trade engine 138. Trade engine 138 may, e.g., receive incoming communications from various channel partners and route those communications to one or more other modules of exchange computer system 100.

One skilled in the art will appreciate that numerous additional computers and systems may be coupled to exchange computer system 100. Such computers and systems may include, without limitation, additional clearing systems (e.g., computer systems of clearing member firms), regulatory systems and fee systems.

The operations of computer devices and systems shown in FIG. 1 may be controlled by computer-executable instructions stored on non-transitory computer-readable media. For example, computer device 116 may include computer-executable instructions for receiving market data from exchange computer system 100 and displaying that information to a user. As another example, clearinghouse module 140 and/or other modules of exchange computer system 100 may include computer-executable instructions for performing operations associated with determining performance bond contributions associated with holdings in products that are based on various types of currency pairs.

Of course, numerous additional servers, computers, handheld devices, personal digital assistants, telephones and other devices may also be connected to exchange computer system 100. Moreover, one skilled in the art will appreciate that the topology shown in FIG. 1 is merely an example and that the components shown in FIG. 1 may be connected by numerous alternative topologies.

Figure 2:
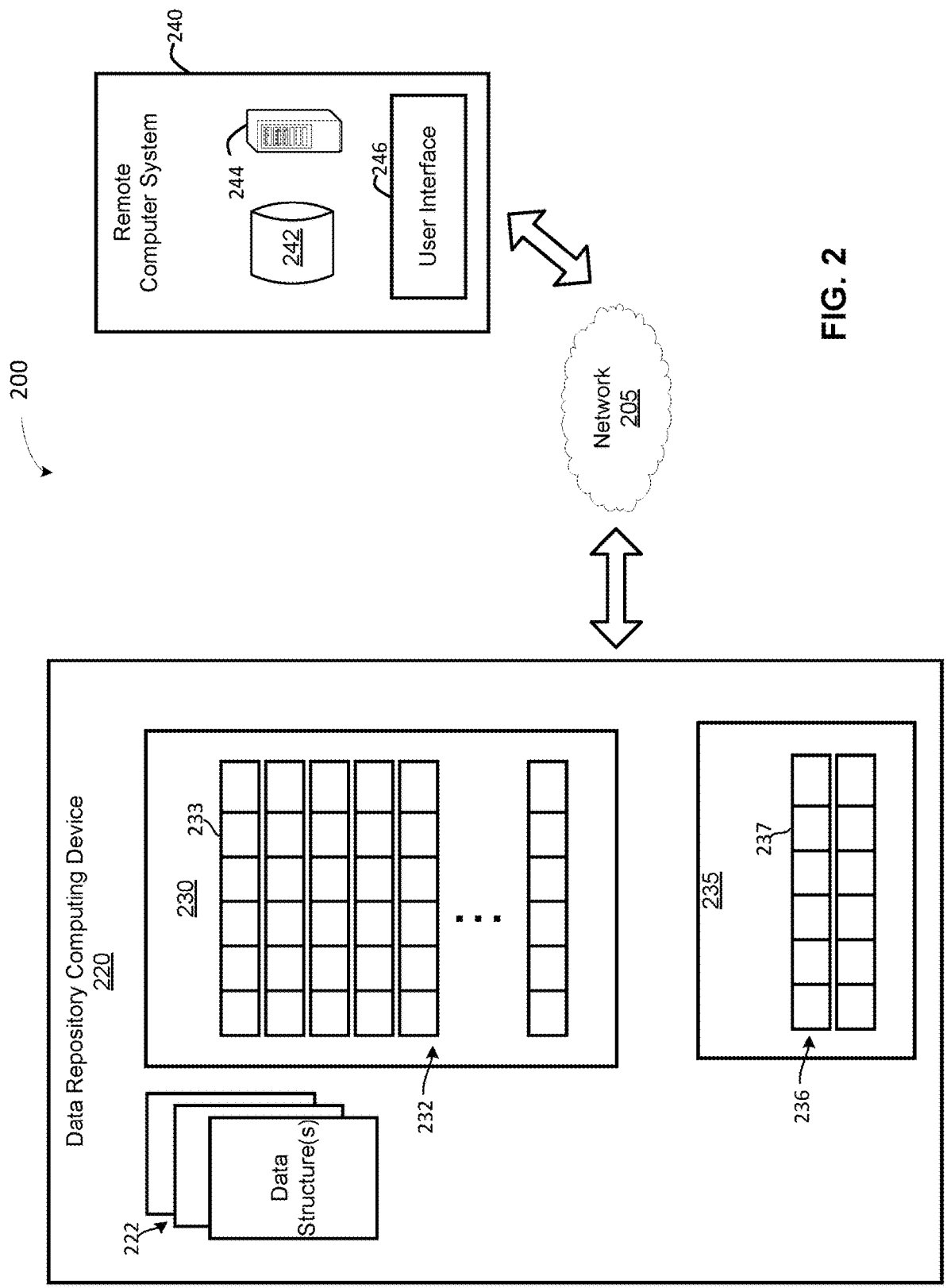
FIG. 2 shows a portion of an illustrative system for adaptive compression of stored data according to aspects of the disclosure.

FIG. 2 shows a portion of an illustrative system 200 for adaptive compression of stored data according to aspects of the disclosure. The system 200 includes a data repository computing device 220 communicatively coupled via a network 205 to one or more computing systems, such as a remote computing system 240. The data repository computing device 220 may include a non-transitory memory device storing a plurality of data structures 222, 230, and 235. In some cases, a data structure may include a plurality of data elements (e.g., line items) 232. Each line item may include a plurality of parameters 233.

In some cases, the remote computer system 240 may include one or more of a data repository 242, a computer device 244 and/or a user interface 246. The remote computer system 240 may be communicatively coupled to at least one additional computer system via the network 505. In some cases, the remote computer system 240 may be configured to obtain information about one or more of the data structures 222, process the information to compress a plurality of data elements 232 of the data structures 222, 230 and communicate information about the compressed data structures (e.g., data structure 235 to remote computing systems to reduce memory requirements associated with storing the data structures 222, 230, and 235 while additionally reducing communication times and/or communications delays associated with communicating such information In some cases, the data repository computing device 220 and/or the remote computer system 240 may be communicatively coupled to one or more additional computing systems (not shown). In some cases, the one or more additional computing systems may communicate (e.g., synchronize) data structure information to and/or from the data repository computing device 220, the remote computer system 240 or both.

In some cases, the remote computing system 240 may monitor a size of each of the plurality of data structures 222 and 230, where the size of the data structure may correspond to the number of data elements of each data structure (e.g., the number of data elements 232 of data structure 230). In some cases, the remote computing system may compare the size of each data structure 222 and 230 to a pre-defined threshold. In some cases, the size of each data structure may be compared to a same threshold or each data structure may be assigned a different threshold based on characteristics of a user, business organization, or data stored in the data structure. For example, the threshold may be 100 data elements, 1,000 data elements, 10,000 data elements or the like. In many cases, the remote computing system may be used to manage memory requirements for a large number of data structures stored on one or more different computing devices.

In some cases, the remote computing system 240 may process a rule set to perform a data compression algorithm based on information stored in the data structure to be compressed. For example, one or more parameters of each data elements 232 may be used in a data compression algorithm such that a plurality of data elements may be compressed to fewer data elements (e.g., 0, 1, 2, etc.). In first step of an illustrative compression algorithm, a value of a first parameter may be used to calculate a first weighting parameter for each data element, where the weighting parameter may be used to compute a weighted value of a second parameter for each data element in a second step. In a third step, a weighted compression parameter may be computed, such as a sum of the weighted value of the second parameter for each of the plurality of data elements of the data structure. In a fourth step, a second compression parameter may be calculated, such as a sum of the unweighted second parameter. In a fifth step, a first data element of a compressed data structure (e.g., 235) may be generated based on information of the original data elements 232 of the uncompressed data structure (e.g., data structure 232). For example, values of each third parameter for each of the data elements 232 may be compared to determine the maximum value and the minimum value. This value may be assigned to the associated parameter of the first data element of the compressed data structure 235 and a second parameter may be calculated as a function of the first compression parameter and the second parameter. In a sixth step, a second compressed data element may be generated using the lowest parameter and a difference between the second compression value and the first compression value. Once generated, the compressed data element 235 may be stored in the data repository 220 to replace the uncompressed data structure 230 and the uncompressed data structure 230 may be deleted.

Illustrative Embodiments

In some cases, the clearinghouse module 140 may be configured to monitor and/or otherwise manage a capital obligation associated with a plurality of swaps, such as a swap portfolio such as by using the process discussed above with respect to FIG. 2. In at least some embodiments, the exchange computer system 100 (or "system 100") receives, stores, generates and/or otherwise and processes data. In accordance with various aspects of the invention, a clearinghouse (e.g., the clearinghouse module 140) may act as a guarantor of the agreement for the derivative. As discussed above, a derivative (e.g., an over the counter swap) may be cleared and guaranteed by the clearinghouse. This may promise more interesting capital efficiencies to allow institutions to reduce a capital charge associated with a plurality of swaps, such as by reducing a gross notional and/or reducing line items associated with the plurality of swaps. In addition, reduction of the number of line items stored in each data structure in the data repository, memory usage may be reduced, along with the associated costs. Communication time and delay requirements may be reduced as well, because fewer and/or smaller data structures may be communicated over the network.

A data repository associated with a financial institution may store thousands of data structures, each having up to ten thousand data elements, each data element corresponding to a financial transaction (e.g., an interest rate swap, an interest rate swap in a foreign currency, and the like). Memory requirements for the financial institution may be reduced by reducing notional amount and/or clearing line items associated with portfolios of swaps that are on an organization's books. In some embodiments, a computer system may access data corresponding to a portfolio that comprises m interest rate swaps, wherein m is an integer greater than one. A financial institution managing the portfolio may have a first data storage capacity large enough to store information associated with the portfolio comprising m interest rate swaps. The accessed data may comprise multiple data components for each of the interest rate swaps, such as a notional value and a fixed rate value. Each of the interest rate swaps may correspond to a common tenor. The computer system may calculate parameters for a compressed swap having a risk value equivalent to a sum of risk values of the interest rate swaps. The parameters may include a compressed swap notional value, a compressed swap fixed rate value, and a compressed swap floating rate spread value. The computer system may optionally determine, based at least on part on the compressed swap parameters, a performance bond requirement attributable to the interest rate swaps. The computer system may compare a determined performance bond requirement to account data associated with a holder of the portfolio and may perform one or more additional actions based on the comparing.

A financial institution associated with the portfolio may have one or more computing systems (e.g., servers, data repositories, processors, etc.) that may be used, at least in part, to store or otherwise manage portfolios of the financial institution's clients. These financial institution computing systems may be sized to manage a specified amount of data associated with aspects of the financial institution's business. This may include managing and/or processing information associated with the portfolios. As portfolios become larger for one or more of the financial institution's clients, the data storage capacity and/or processing power necessary to process and/or store this information may approach a storage capacity and/or processing power limit of the currently installed hardware. As such, the financial institution may be required to install more computing devices and/or upgrade existing computing components to handle the additional information storage and/or processing requirements. By monitoring, or otherwise managing the size of one or more portfolios, the financial institution may proactively manage the computing requirements and the associated costs. For example, the financial institution may monitor a size of a client's portfolio. If the portfolio size approaches a threshold, the financial institution computing system may automatically initiate a portfolio compression process. In other cases, the financial institution computing system may provide an indication to an individual, such as a network manager, that the computing system is approaching the limits to allow manual initiation of a portfolio compression process.

In some cases, a method for reducing a notional amount and/or clearing line items associated with a portfolio of swaps may include determining at least a first fixed rate for use in blending a plurality of swaps. Each of the swaps may have matching economics and a different associated fixed rate. In some cases, the swaps may include non-matched data, such as different rates associated with different data elements. The method may further include determining, by one or more computing devices, a first remnant swap using the first fixed rate and determining a second remnant swap using a second fixed rate, wherein the second fixed rate is different from the first fixed rate.

In some cases, a non-transitory computer-readable medium may contain computer-executable instructions, that when executed by a processor, cause one or more computing devices to determine a first blend rate for use in blending a plurality of swaps. Each of the plurality of swaps may have matching economics and a different associated fixed rate. The instructions may further cause the one or more computing devices to determine a first remnant swap using the first blend rate and to determine a second remnant swap using the second blend rate to blend the plurality of swaps.

In some cases, a system for reducing notional amount and/or clearing line items associated with swaps that are on an organization's books may include a network and one or more computing devices. The computing devices may include a processor and one or more non-transitory memory devices storing instructions that, when executed by the processor, cause the one or more computing devices to determine a first blend rate and a second blend rate for use in blending a plurality of swaps. Each of the plurality of swaps may have matching economics and a different associated fixed rate. The instructions may further cause the one or more computing devices to determine a first remnant swap using the first blend rate and determine a second remnant swap using the second blend rate to blend the plurality of swaps together with first remnant swap. The one or more computing devices may then communicate, via the network, information corresponding to the first remnant swap and the second remnant swap to an institution associated with the plurality of swaps.

In some cases, a method for compressing a portfolio of swaps may be implemented by a computer device and include determining a fixed rate for use in blending a plurality of swaps, where each of the plurality of swaps may have matching economics and a different associated fixed rate. A computing device may further determine a blended swap for blending the plurality of swaps using the fixed rate, wherein a gross notional of the blended swap could be less than the gross notional amount for the plurality of swaps and/or reducing the number of clearing line items.

In some cases, stored data may include information corresponding to trading of one or more financial products. For example, over-the-counter (OTC) products include financial instruments that are bought, sold, traded, exchanged, and/or swapped between counterparties. Many OTC derivatives exist to fill a wide range of needs for counterparties, including limiting or mitigating exposure to risks and/or maximizing cash flow. After an exchange of an OTC product, counterparties may expend resources managing the product for the duration of its life. Management may be complicated based on the number of exchanges and/or the specific terms of the contract.

An interest rate swap (IRS) is an example of a type of OTC product where the parties agree to exchange streams of future interest payments based on a specified principal or notional amount. Each stream may be referred to as a leg. Swaps are often used to hedge certain risks, for instance, interest rate risk. They can also be used for speculative purposes.

An example of a swap includes a plain fixed-to-floating, or "vanilla," interest rate swap. The vanilla swap includes an exchange of interest streams where one stream is based on a floating rate and the other interest stream is based on a fixed rate. In a vanilla swap, one party makes periodic interest payments to the other based on a fixed interest rate. In return for the stream of payments based on the fixed rate, the party may receive periodic interest payments based on a variable rate. The payments are calculated over the notional amount.

The variable rate may be linked to a periodically known or agreed upon rate for the term of the swap such as the London Interbank Offered Rate (LIBOR). This rate is called variable, because it is reset at the beginning of each interest calculation period to the then current reference rate, such as LIBOR published rate. The parties to an IRS swap generally utilize these exchanges to limit, or manage, exposure to fluctuations in interest rates, or to obtain lower interest rates than would otherwise be unobtainable.

Usually, at least one of the legs to a swap has a variable rate. The variable rate may be based on any agreed upon factors such as a reference rate, the total return of a swap, an economic statistic, etc. Other examples of swaps include total return swaps, and Equity Swaps.

The expiration or maturity of the future streams of payments may occur well into the future. Each party may have a book of existing and new IRSs having a variety of maturity dates. The parties may expend substantial resources tracking and managing their book of IRSs and other OTC products. In addition, for each IRS, the party maintains an element of risk that one of its counterparties will default on a payment.

Currently, financial institutions such as banks trade interest rate payments and/or interest rate swaps over the counter. Steams of future payments must be valued to determine a current market price. The market value of a swap is the sum of the difference between the present value of the future fixed cash flows and the floating rate and the price of the swap is determined based on the fixed rate. Because the fixed rate of a particular swap is determined based on the available fixed rate at the time the price is struck, the fixed rates associated with two different swaps will rarely be the same. As such, each swap that is struck causes a separate line item to be booked until an opposite swap with the same fixed rate is struck. As such, it would be desirable to provide a way to blend coupons for reducing notional amounts and/or line items (e.g., swaps) on a financial organization's books.

In some cases, clients may desire to enter into one or more swaps (e.g., interest rate swaps) for hedging a position in a market. For example, an organization may have multiple positions in fixed rate mortgages, while having less exposure to products associated with a floating rate. At such times, the organization may desire to enter into one or more swaps with another party to hedge risks that may be associated with having a majority of fixed rate products. For example, when interest rates fall, the organization may make money by having a majority of fixed rate products in a portfolio. However, when the market goes up (e.g., interest rates rise), the organization may lose the opportunity to profit from the higher interest rates. By hedging these risks, the parties to the interest rate swaps may have a goal to allow their assets and/or liabilities to at least remain near the starting levels and/or minimize any losses. Generally, an available fixed rate dictates the price of a swap, where the fixed rate available at the market changes over time. For example, a dealer may quote a swap at a first rate at a time 0. A short time later (e.g., about 10 minutes, about 30 minutes, etc.), the same dealer may provide a quote for a similar swap, but having a second rate that is different from the first rate. Once the swaps are entered, the fixed rate will remain fixed for the lifetime of the swap. Over time, a swap purchaser (e.g., an individual, an organization, a business, etc.) may develop a portfolio of swaps, including the swaps of at least one payer swap (e.g., providing the fixed rate leg of the swap) and/or at least one receiver swap (e.g., providing the floating rate leg of the swap). Few, if any, swaps may have the same interest rate resulting in a large number of swaps to remain open on the organization's books.

An organization or an individual may enter into multiple swaps during a given period (e.g., a day, a week, a month, etc.) and, as a result, may have multiple line items in their books in relation to these swaps. For example, a customer may have a first swap for paying a set amount (e.g., $100 million) and a second swap for receiving the same set amount (e.g., $100 million). Although these swaps are associated with the same notional amount, the interest rates are likely to be different. As such, these swaps will not net out. Rather, the $200 million remains open on the organization's books. These swaps may further be subject to regulatory requirements, such as governmental requirements, international banking requirements (e.g., BASEL 3 requirements), and/or the like. These regulatory requirements may subject the organization to capital charges (e.g., a specified cash reserve) to ensure that a financial organization has enough cash to cover their liabilities regarding their swap portfolio.

In an illustrative example, a financial institution may have a house account having a number of swaps open in the account. Under the regulatory requirements, the financial institution is required to set aside capital (e.g., a margin account) to cover the open swaps. This cash requirement may be dependent upon, at least in part, on the gross notional amount and/or the total clearing line items associated with the swap portfolio. As such, the financial organization can reduce its capital requirements by reducing the number of line items on their books, and/or by reducing the gross notional of the swap portfolio.

In some cases, multiple line items having the same interest rate may be collapsed together (e.g., canceled). For example, a pay swap having an associated first notional amount of may be offset by a second notional amount associated with a receive swap when the pay and receive swaps have the same interest rate. However, this is rare. For example, a swap participant may use an investment strategy for achieving the same fixed rate for two or more different swaps. In such cases, the customer may specify a desired rate for a swap when contacting a dealer. While the dealer may be able to find a counter-party willing enter into a swap at that rate, the swap may incur a fee to equalize the economics of the swap. For example, at the desired fixed rate, the economics of the swap may favor the paying party or the receiving party. By equalizing these differences, the swap may then be structured to allow the total value of the fixed rate leg to be equal to the floating rate leg of the swap. In general, when the interest rates are determined for the swaps, the precision may be specified by one or more parties to the swap. In some cases, the precision of the rates may be limited to a defined precision common to the market, such as about 2 decimal places, about 5 decimal places, up to 7 decimal places. In other cases, the rate precision may be specified to be a precision greater than 7 decimal places, such as 11 decimal places, up to 16 decimal places, etc.)

In some cases, a clearinghouse may monitor a portfolio of swaps to determine whether any of the total notional value of the swap portfolio may be canceled or otherwise offset. For example, the clearing house may, on a periodic (e.g., daily) basis, process an algorithm to determine a net value of a client's swap portfolio and send a message to the client to terminate a line item, or offset at least a portion of the gross notional value when two or more line items may be collapsed.

In the past, the over-the-counter swap market was largely a bespoke market, where a customer desiring to enter into a swap would contact, such as by telephone, one or more dealers to determine which dealer would offer the best price to enter into the deal. In such cases, the swap may be entered on a common platform, but the trade execution was completed by phone. Because swaps may not be fully transparent, governmental regulations have required that swaps be executed via a Swap Execution Facility (SEF). A SEF is a regulated platform for swap trading that provides pre-trade information, such as bids, offers, and the like, and/or an execution mechanism to facilitate execution of swap transactions among eligible participants. Over time more and more types of swaps may be executed via a SEF, such as interest rate swaps. Because the SEF may operate using a more automated swap market mechanism, the likelihood that a customer may enter into different swaps, where each share a same interest rate will become increasingly rare. A SEF may execute many swaps with multiple coupons at a centralized location. In some cases, different swaps may share the same, or similar, economics to another swap. However, the coupons are likely to differ due to the swaps executing at different times. As such, a client may quickly build a book (e.g., swap portfolio) with many swap line items, which, in turn, would require the client to incur a large capital obligation corresponding to the gross notional and/or the total clearing line items of the book of swaps.

Figure 3:
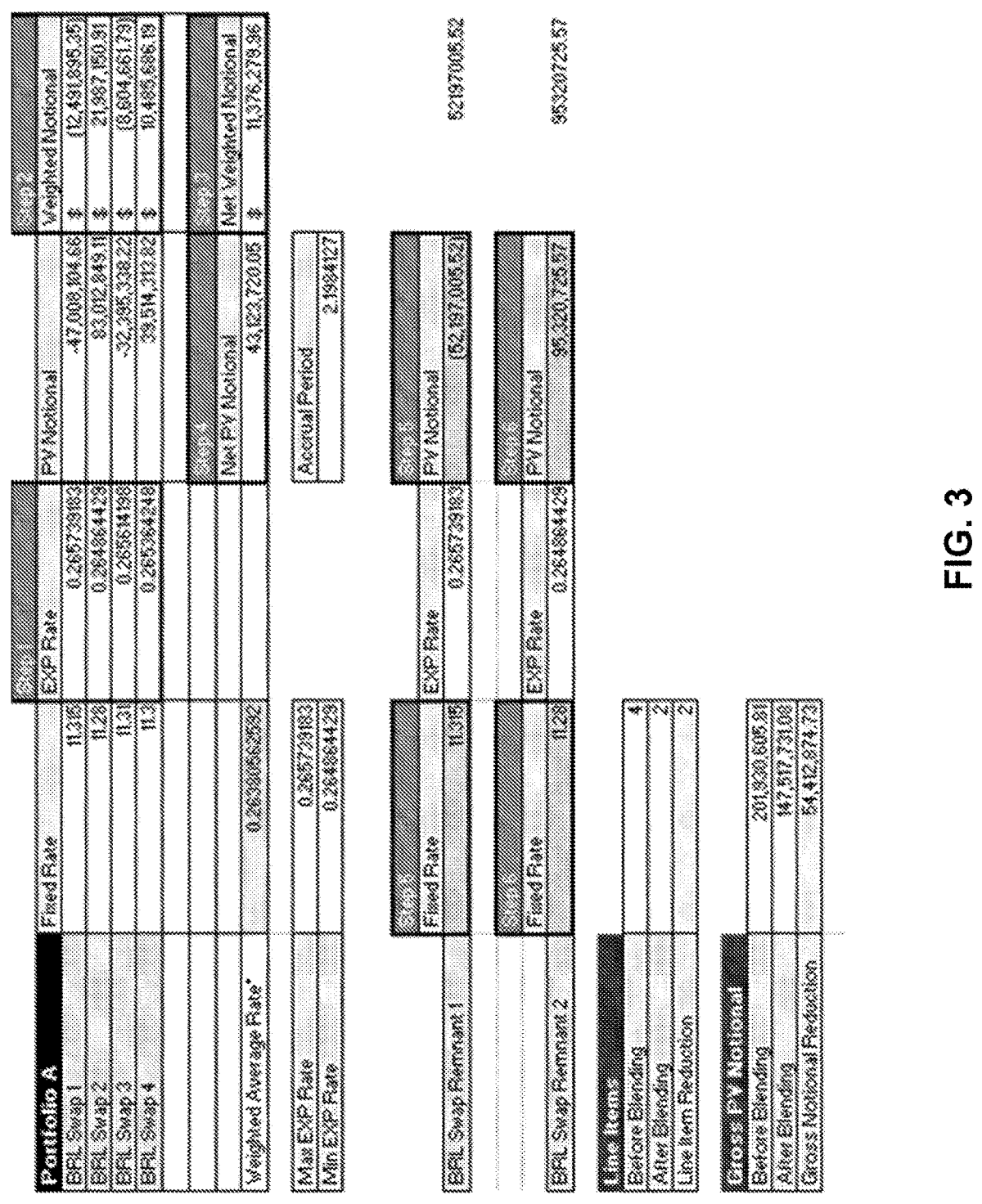
Figure 4:
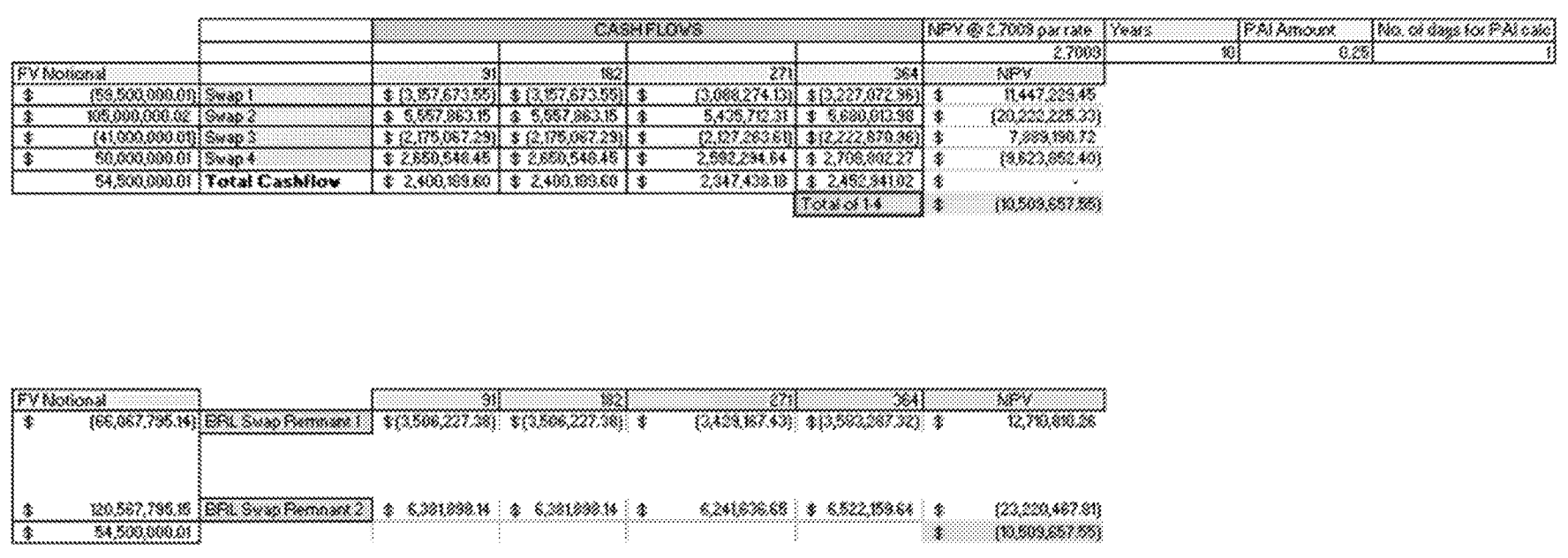

FIGS. 3 and 4 show illustrative data tables corresponding to a method for adaptive compression of stored data according to aspects of the disclosure. FIG. 3 shows an illustrative chart showing operations performed by computer system 100 and/or the computer system 200 and/or 500. According to some examples, adaptive compression of stored data with calculating parameters such as for a hypothetical condensed swap portfolio may be performed based on the illustrative steps of FIG. 3. In some cases, the following description of some embodiments refers to operations performed by clearinghouse module 140. In other embodiments, however, some or all of these operations may be performed by other modules of computer system 100 and/or by modules of one or more other computer systems.

Currently, the unilateral "risk-free" compression of stored data, such as those comprising Brazilian Real (BRL) CDI interest rate swaps (BRL swaps) is limited to standard netting, where the fixed rate on trades within a compression group must match. This problem will limit the line item and gross notional reduction that is possible, therefore not allowing for maximum compression of the stored data. The current disclosure discusses this problem, allowing the stored data to be adaptively compressed such as by compressing BRL swaps with differing fixed rates, increasing an amount of stored data (e.g. data corresponding to electronic trades) eligible for compression and, therefore, maximizing the reduction of consumed memory usage and/or allowing for more efficient use of bandwidth in communicating information about the stored data.

While some memory compression algorithms may utilize information stored in the data structures to be compressed, additional parameters and/or other requirements may be required. For example, other BRL swap compression solutions may either a) require the fixed rate to match on eligible trades and/or b) are multilateral solutions requiring the portfolios of 2+ trading participants to achieve reduction in line items or gross notional.

For stored data such as a portfolio of BRL Swaps, adaptive data compression algorithms, such as coupon blending, can be achieved by following the steps outlined below. The original stored data (e.g., the portfolio 222) will be reduced to a smaller stored data structure comprising two remnant trades, where the gross notional will also be reduced. FIGS. 3 and 4 show illustrative examples of a computing system processing a set of rules to perform compression of a data structure storing multiple line items, here shown as a six-step process.

Rule Set

Step 1: Calculate the EXP Rate for each trade within the portfolio.

$$\text{EXP Rate} = (1+r)^{n/252} - 1$$

Where:
EXP Rate=exponential weighting
r=fixed rate
n=Brazil business days in the accrual period Step 2: Calculate the Weighted Notional (WN) for each trade within the portfolio based on a present value (PV) notional.

$$\text{WN} = \text{PV Notional} * \text{EXP Rate}$$

Where:
PV Notional (PVN)=Present Value Notional

Step 3: Calculate the Net Weighted Notional (NWN) of the portfolio $$\text{NWN} = \Sigma(\text{WN})$$

Step 4: Calculate the Net PV Notional (NPN)

$$\text{NPN} = \Sigma(\text{PVN})$$

Step 5: Create BRL Swap Remnant 1 by assigning it the highest fixed rate of the original portfolio and calculating the PV Notional of Remnant 1 (PVR1).

$$\text{PVR1} = (\text{NWN} - \text{NPN} * e\_{min})/(e\_{max} - e\_{min})$$

Where:
$e\_{min}$=EXP rate of lowest fixed rate
$e\_{max}$=EXP rate of highest fixed rate Step 6: Create BRL Swap Remnant 2 by assigning it the lowest fixed rate of the original portfolio and calculating the PV Notional of Remnant 2 (PVR2).

$$\text{PVR2} = \text{NPN} - \text{PVR1}$$

BRL Swap coupon blending reduces operational risk and process times by decreasing the number of line items (trades) that a system must process, maintain and report without changing the cash flows of the original portfolio. The illustrative process may be used to compress the data structures to minimize memory usage associated with a plurality of stored portfolios. The described algorithm may also reduce the gross notional outstanding of eligible trades resulting in a decrease of capital that a Clearing Member Firm must hold against their cleared swap portfolio.

Figure 5:
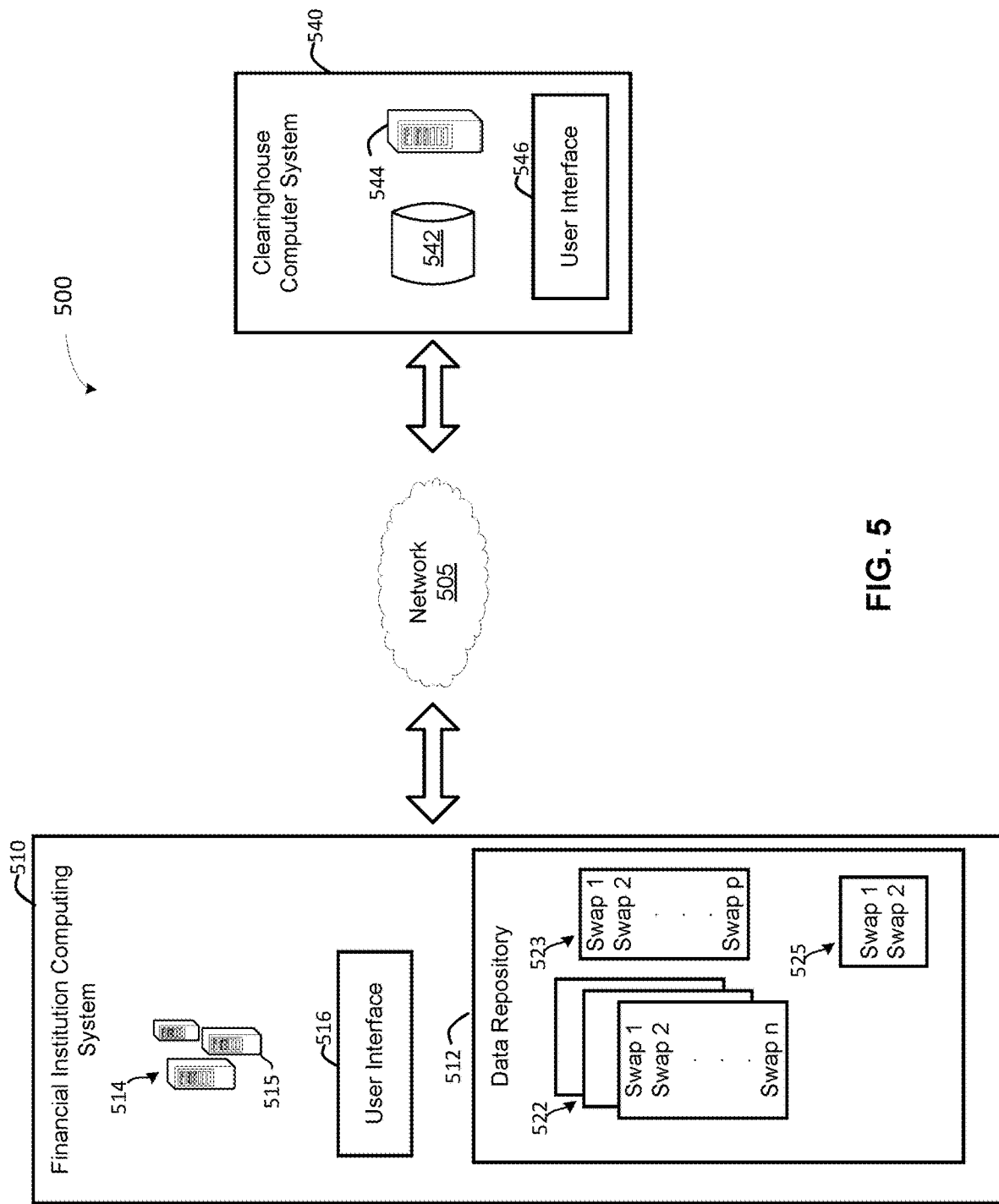
FIG. 5 shows a portion of an illustrative system for adaptive compression of stored data according to aspects of the disclosure.

FIG. 5 shows a portion of an illustrative system 500 for adaptive compression of stored data, such as blending coupons associated with a plurality of swaps. In some cases, the illustrative system 500 may include a financial institution computing system 510 communicatively coupled to a clearinghouse computer system 540 via a network 505 (e.g., a wide area network (WAN), the LAN 124, the Internet 126, etc.). The financial institution computing system 510 may include a data repository 512, one or more computing devices 514, and, in some cases, at least one user interface 516. In some cases, the data repository 512 may store information about one or more swap portfolios 522 in one or more data structures, where the swap portfolios may include information about two or more different swaps (e.g., swap 1, swap 2, swap n, etc.). For example, the swap information may include a fixed rate value, a floating rate value, a notional value, and/or a cash value for each of the plurality of different swaps of the swap portfolios 522. A data structure 523 may be stored corresponding to an adaptive compression of one or more of the swap portfolio 522, which reducing memory usage and/or bandwidth requirements in communicating data associated with the data structure 523. In some cases, a compressed data structure 525 may be reduced to a single data entry, two data entries, or the like. In some cases, a portfolio may be fully compressed such that all entries cancel, and the uncompressed portfolio may be deleted. The adaptive compression of the data may be performed based on the data stored in the data structure(s) being compressed, such as the swap portfolios 522. In some cases, the swap portfolios 522 may be associated with the financial institution, and/or one or more different customers of the financial institution. For example, a financial entity and/or a customer of the financial entity may desire to enter into one or more different swaps to hedge financial risk due to a plurality of fixed rate holdings and/or a plurality of floating rate holdings. In some cases, a computing device 515 and/or the user interface 516 may be used to facilitate user access to the one or more swap portfolios 522. For example, a user may log into the financial institution computing system 510 via one or more user interface screens accessible via the user interface 516. In some cases, the user interface 516 is at a geographical location local to the financial institution computer system 510 and/or at a geographical location of the user.

In some cases, the clearinghouse computer system 540 may include one or more of a data repository 542, a computer device 544 and/or a user interface 546. The clearinghouse computer system 540 may be communicatively coupled to at least one financial institution computer system, such as the financial institution computing system 510 via the network 505. In some cases, the clearinghouse computer system 540 may be configured to obtain information about one or more of the swap portfolios 522, process the information to blend coupons associated with the different swaps of the swap portfolios 522 and communicate information about the blended swaps to the financial institution computing system 510 to reduce one or more line items associated with the swap portfolios 522 and/or to reduce a gross notional value associated with the swap portfolios 522 to reduce memory requirements while additionally reducing a total capital charge incurred by the financial institution in relation to the swap portfolios 522.

The present invention has been described herein with reference to specific exemplary embodiments thereof. It will be apparent to those skilled in the art that a person understanding this invention may conceive of changes or other embodiments or variations, which utilize the principles of this invention without departing from the broader spirit and scope of the invention as set forth in the appended claims.

We claim:

1. A system for managing memory corresponding to a plurality of electronic transactions, the system comprising:
    a processor; and
    a non-transitory memory device storing instructions that when executed by the processor cause the processor to:
        monitor a size of a data structure stored in a data repository coupled with the processor, wherein the size corresponds to a number of data elements of the data structure and each data element includes first and second parameters associated with a corresponding electronic transaction;
        compare the size of the data structure to a threshold and when the size of the data structure meets the threshold:
            calculate a value of a first compression parameter based on values of the first and second parameters of each data element of the data structure;
            calculate a value of a second compression parameter based the value of the first parameter of each data element of the data structure;
            generate a compressed data structure based on the value of the first compression parameter and the second compression parameter, the compressed data structure comprising a first data element generated as a function of a difference between the value of the first compression parameter and the second compression parameter, and a second data element generated based on a difference between the value of the second compression parameter and a value of the first data element; and
            replace, in the data repository, the data structure with the compressed data structure.

2. The system of claim 1, wherein the data structure stores an electronic record of a plurality of electronic transactions corresponding to an associated user.

3. The system of claim 2, wherein each line item of the data structure corresponds to a different electronic transaction.

4. The system of claim 3, wherein each electronic transaction corresponds to a different interest rate swap.

5. The system of claim 4, wherein the interest rate swap is a Brazilian Real (BRL) interest rate swap (BRL swap).

6. The system of claim 4, wherein the first parameter corresponds to a notional value of an associated electronic transaction and the second parameter corresponds to an interest rate of the associated electronic transaction.

7. A computer implemented method for managing memory corresponding to a plurality of electronic transactions, the method comprising:
    monitoring, by a processor, a size of a data structure stored in a data repository coupled with the processor, wherein the size corresponds to a number of data elements of the data structure and each data element includes first and second parameters associated with a corresponding electronic transaction;
    comparing, by the processor, the size of the data structure to a threshold and when the size of the data structure meets the threshold:
        calculating, by the processor, a value of a first compression parameter based on values of the first and second parameters of each data element of the data structure;
        calculating, by the processor, a value of a second compression parameter based the value of the first parameter of each data element of the data structure;
        generating, by the processor, a compressed data structure based on the value of the first compression parameter and the second compression parameter, the compressed data structure comprising a first data element generated as a function of a difference between the value of the first compression parameter and the second compression parameter, and a second data element generated based on a difference between the value of the second compression parameter and a value of the first data element; and
        replacing, by the processor in the data repository, the data structure with the compressed data structure.

8. The computer implemented method of claim 7, wherein the data structure stores an electronic record of a plurality of electronic transactions corresponding to an associated user.

9. The computer implemented method of claim 8, wherein each line item of the data structure corresponds to a different electronic transaction.

10. The computer implemented method of claim 9, wherein each electronic transaction corresponds to a different interest rate swap.

11. The computer implemented method of claim 10, wherein the interest rate swap is a Brazilian Real (BRL) interest rate swap (BRL swap).

12. The computer implemented method of claim 10, wherein the first parameter corresponds to a notional value of an associated electronic transaction and the second parameter corresponds to an interest rate of the associated electronic transaction.

13. The computer implemented method of claim 7, wherein the data structure is one of a plurality of data structures stored in the data repository, each corresponding to a different associated user, the method further comprising iteratively processing each of the plurality of data structures to compare with the threshold and generating a compressed data structure based thereon.

14. A memory management computing device configured to manage memory corresponding to a plurality of electronic transactions, the memory management computing device comprising:
 a processor; and
 a non-transitory memory device storing instructions that when executed by the processor cause the memory management computing device to:
  monitor, via a network connection, a size of a data structure stored in a data repository coupled with the memory management computing device via the network connection, wherein the size corresponds to a number of data elements of the data structure and each data element includes first and second parameters associated with a corresponding electronic transaction;
  compare the size of the data structure to a threshold and when the size of the data structure meets the threshold:
   calculate a value of a first compression parameter based on values of the first and second parameters of each data element of the data structure;
   calculate a value of a second compression parameter based the value of the first parameter of each data element of the data structure;
   generate a compressed data structure based on the value of the first compression parameter and the second compression parameter, the compressed data structure comprising a first data element generated as a function of a difference between the value of the first compression parameter and the second compression parameter, and a second data element generated based on a difference between the value of the second compression parameter and a value of the first data element; and
   replace, in the data repository, the data structure with the compressed data structure.

15. The memory management computing device of claim 14, wherein the data structure stores an electronic record of a plurality of electronic transactions corresponding to an associated user.

16. The memory management computing device of claim 15, wherein each line item of the data structure corresponds to a different electronic transaction.

17. The memory management computing device of claim 16, wherein each electronic transaction corresponds to a different interest rate swap.

18. The memory management computing device of claim 17, wherein the interest rate swap is a Brazilian Real (BRL) interest rate swap (BRL swap).

19. The memory management computing device of claim 17, wherein the first parameter corresponds to a notional value of an associated electronic transaction and the second parameter corresponds to an interest rate of the associated electronic transaction.

20. The memory management computing device of claim 14, wherein the data structure is one of a plurality of data structures stored in the data repository, each corresponding to a different associated user, and wherein the instructions, when executed by the processor, further cause the memory management device to iteratively process each of the plurality of data structures to compare with the threshold and generate a compressed data structure based thereon.

* * * * *